(12) United States Patent
Abe

(10) Patent No.: US 8,530,866 B2
(45) Date of Patent: Sep. 10, 2013

(54) PATTERN OBSERVATION METHOD

(75) Inventor: Hideaki Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 12/709,264

(22) Filed: Feb. 19, 2010

(65) Prior Publication Data
US 2011/0012029 A1 Jan. 20, 2011

(30) Foreign Application Priority Data
Jul. 16, 2009 (JP) .................................. 2009-167793

(51) Int. Cl.
*G21K 5/04* (2006.01)
(52) U.S. Cl.
USPC ...... 250/492.3; 250/306; 250/307; 250/492.1
(58) Field of Classification Search
USPC ............. 250/306, 307, 310, 311, 396 R, 398, 250/399, 492.1, 492.2, 492.22, 492.3
See application file for complete search history.

(56) References Cited

U.S. PATENT DOCUMENTS

| 7,109,485 B2 | 9/2006 | Takane et al. |
| 7,442,923 B2 | 10/2008 | Todokoro et al. |
| 2008/0050848 A1 | 2/2008 | Abe |

FOREIGN PATENT DOCUMENTS

| JP | 10-221046 | 8/1998 |
| JP | 2002-260994 | 9/2002 |
| JP | 2002-270655 | 9/2002 |

*Primary Examiner* — Robert Kim
*Assistant Examiner* — Hanway Chang
(74) *Attorney, Agent, or Firm* — Finnegan, Henderson, Farabow, Garrett & Dunner, L.L.P.

(57) ABSTRACT

The pattern observation method for observing a pattern which is formed on an insulating film, includes: irradiating an entirety of the pattern with a charged particle beam, to obtain a temporary image of the pattern which has region information of a convex pattern and a concave pattern; irradiating the convex and concave patterns with the charged particle beam having a first and second voltages based on the region information, to thereby form an electric field between a top surface of the convex pattern and a bottom surface of the concave pattern so that charged particles emitted from the bottom surface of the concave pattern may be drawn out to an outside of the pattern; and irradiating the entirety of the pattern with the charged particle beam to obtain an image of the pattern having the information of the bottom surface of the concave pattern.

20 Claims, 12 Drawing Sheets

PATTERN OBSERVATION METHOD

CROSS-REFERENCE TO RELATED APPLICATION

This application is based upon and claims the benefit of priority from prior Japanese Application No. 2009-167793, filed on Jul. 16, 2009, the entire contents of which are incorporated herein by reference.

BACKGROUND OF THE INVENTION

1. Field of the Invention

The present invention relates to a pattern observation method, more specifically to, a pattern observation method for observing semiconductor device patterns by irradiating them with charged particle beams.

2. Background Art

In recent years, with a progress in fine patterning and multi-layer processing of semiconductor devices, a pattern of holes (contact holes, via holes, etc.) having a large aspect ratio have been used in many cases. To accommodate this trend, it is increasingly necessary to observe the processing state of a pattern bottom surface, for example, to confirm that an insulator on the bottom surface of a hole pattern is sufficiently removed or check if a width of the hole pattern bottom surface satisfies specifications.

As such a fine structure observation method in the semiconductor process, an optical method and a method using a charged-particle beam are available.

First, as one of the optical pattern observation methods, a method referred to as scatterometry is known (see, for example, Japanese Patent Application Laid-Open No. 2002-260994). By this method, a pattern to be observed is irradiated with light and then its shape is guessed from a spectrum of the reflected light. Since this method utilizes the diffraction of light, a target to be observed needs to be a regular pattern. Therefore, this method cannot observe irregular patterns such as those of system LSI device patterns. Even in a regular pattern, a local pattern such as an endmost pattern of it cannot be observed.

Next, as one of the pattern observation methods by use of charged particle beams, a scanning electron microscope (SEM) is known which uses electron beams as a probe. For example, in the case of observing device pattern of a semiconductor device, the SEM irradiates the device pattern with an electron beam (primary electrons), thereby producing secondary electrons from a surface of the device pattern. Then, the SEM detects the secondary electrons with a detector and generates an observation image (hereinafter referred to as secondary electron image) from detected data of the secondary electrons. The secondary electron image can be used to observe a shape of the device pattern, thereby measuring a width of the device pattern.

However, by an ordinary observation method by use of the SEM, it is difficult to clearly observe the bottom surface of patterns having a large aspect ratio by using the secondary electron image. The reasons will be described as follows. As one example, a line and space pattern (hereinafter referred to as L/S pattern) in which a line pattern and a space pattern are disposed periodically will be used as an observation target in the description.

If the space pattern has a large width as compared to a height of the line pattern, that is, the aspect ratio is small, secondary electrons generated from a bottom surface of the space pattern (hereinafter referred to as space bottom surface), when it is irradiated with an electron beam, strike side walls of the line pattern little and are emitted to an outside of the L/S pattern, thus reaching the detector. Accordingly, the space bottom surface can be observed brightly. On the other hand, if the aspect ratio is large, the secondary electrons generated from the space bottom surface readily strike the side walls of the line pattern, thus reaching the detector less. Therefore, the space bottom surface cannot brightly be observed.

Incidentally, a method is proposed for observing a space bottom surface brightly in a case where the space bottom surface is electrically continuous with a substrate kept to a ground potential and a line pattern is discontinuous with the substrate (see, for example, Japanese Patent Application Laid-Open No. 2002-270655). By this method, an entire L/S pattern serving as a sample is irradiated with an electron beam beforehand to positively charge the sample and then irradiated with the electron beam, thereby obtaining a secondary electron image. By this method, a space bottom can be observed brightly even if the aspect ratio is large. The reasons will be described as follows. If the entire L/S pattern is irradiated with an electron beam, the line pattern's top surface (hereinafter referred to as line top surface) is positively charged, but the space bottom surface is not charged because it is grounded. If the pattern is irradiated with the electron beam after such a charged state is established, the secondary electrons emitted from the space bottom surface are drawn out of the L/S pattern by the positive charge on the line top surface, thus reaching the detector. Thus, the space bottom surface can be observed brightly.

SUMMARY OF THE INVENTION

According to a first aspect of the present invention, a pattern observation method for observing a pattern formed on an insulating film and having a concave pattern and a convex pattern is provided, the method including:

irradiating both of the concave pattern and the convex pattern in the pattern with a first observing charged particle beam, to obtain a temporary image of the pattern having region information of a convex pattern region corresponding to the convex pattern and region information of a concave pattern region corresponding to the concave pattern;

irradiating the convex pattern region in the pattern with an electric field forming charged particle beam having a first incident voltage and the concave pattern region in the pattern with an electric field forming charged particle beam having a second incident voltage different from the first incident voltage based on the region information of the convex pattern region and the region information of the concave pattern region respectively, thereby forming an electric field between a top surface of the convex pattern and a bottom surface of the concave pattern so that charged particles emitted from the bottom surface of the concave pattern when this bottom surface is irradiated with the charged particle beam may be drawn out of the pattern; and irradiating both of the concave pattern and the convex pattern in the pattern with a second observing charged particle beam after the electric field is formed, to obtain an image of the pattern having the information of the bottom surface of the concave pattern.

According to a second aspect of the present invention, a pattern observation method for observing a line and space pattern formed on an insulating film and having a line pattern and a space pattern is provided, the method including:

irradiating both of the line pattern and the space pattern in the line and space pattern with a first observing electron beam, to obtain a temporary image of the line and space pattern having region information of a line pattern region corresponding to the line pattern and region information of a space pattern region corresponding to the space pattern;

irradiating the line pattern region with an electric field forming electron beam having a first incident voltage and the space pattern region with an electric field forming electron beam having a second incident voltage which gives a smaller secondary electron emission coefficient than that by the first incident voltage based on the region information of the line pattern region and the region information of the space pattern region respectively, thereby forming an electric field between a top surface of the line pattern and a bottom surface of the space pattern so that secondary electrons emitted from the bottom surface of the space pattern when this bottom surface is irradiated with the electron beam may be drawn out of the line and space pattern; and irradiating both of the line pattern and the space pattern in the line and space pattern with a second observing electron beam after the electric field is formed, to obtain an image of the line and space pattern having the information of the bottom surface of the space pattern.

BRIEF DESCRIPTION DRAWINGS

FIG. 2(a) is a plan view of the L/S pattern, and FIG. 2(b) is a cross-sectional view taken along line A-A of FIG. 2(a);

FIGS. 4(a) and 4(c) show a schematic diagram of a secondary electron image, and FIG. 4(b) is a cross-sectional view of the L/S pattern, showing a charged state after scanning is completed;

FIG. 7(a) is a plan view of the hole pattern, and FIG. 7(b) is a cross-sectional view taken along line A-A;

FIGS. 10(a) and 10(c) show a schematic diagram of a secondary electron image, and FIG. 10(b) is a cross-sectional view of the two-step hole pattern, showing a charged state after scanning is completed;

Figure 11:
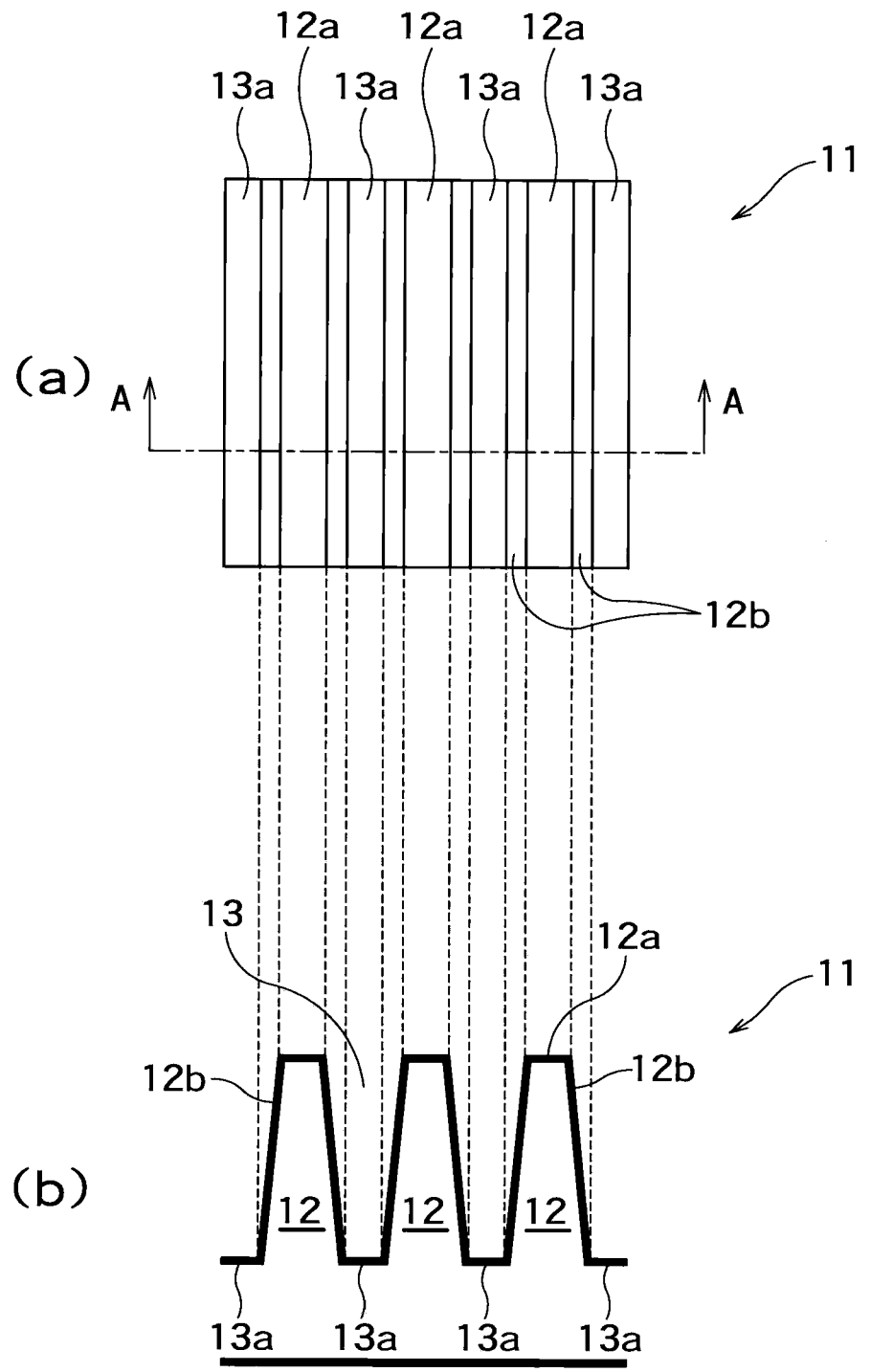
Figure 12:
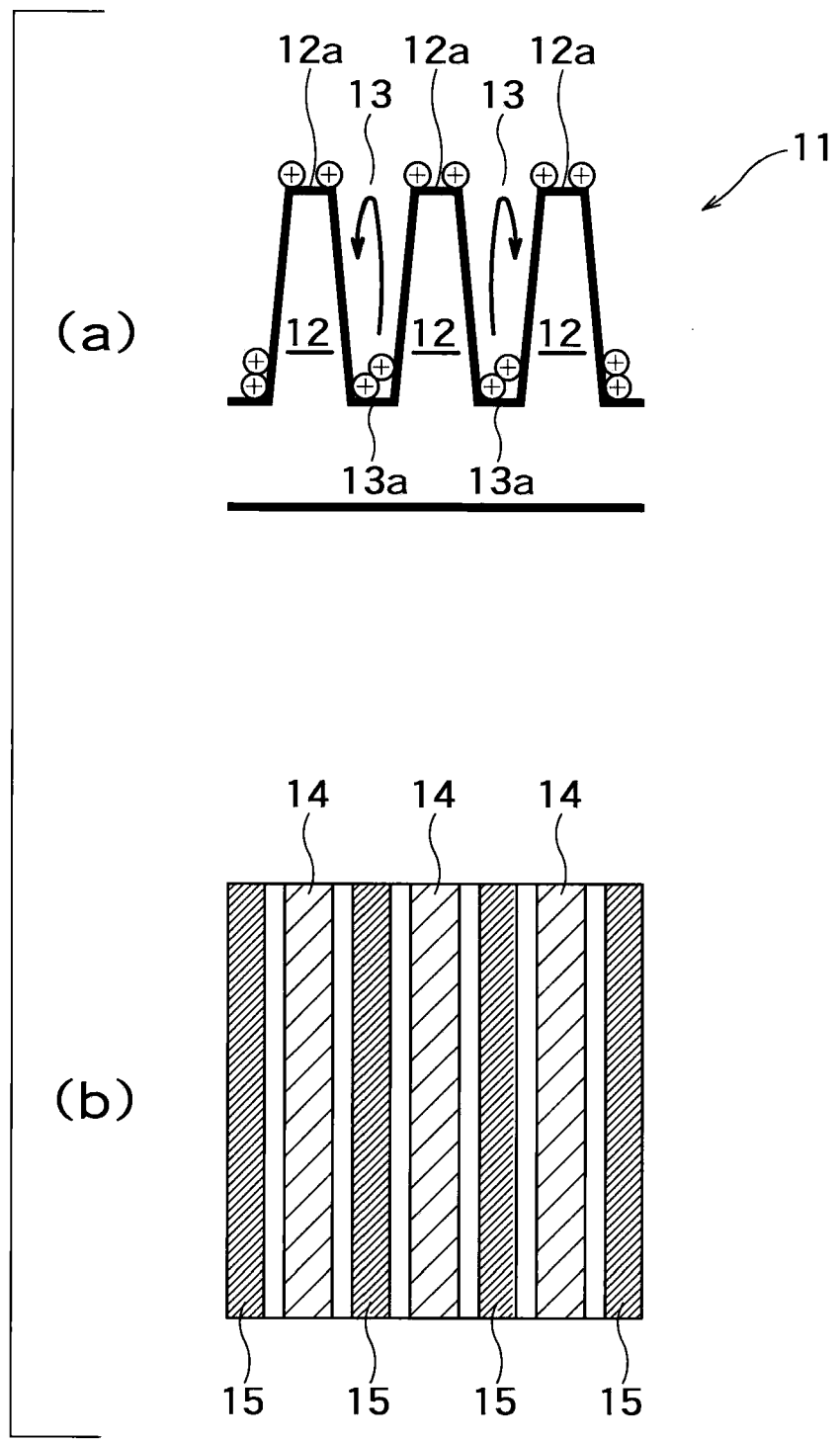

FIG. 11 is an explanatory diagram of a pattern observation method according to a comparison example, FIG. 11(a) is a plan view of an L/S pattern to be observed, and FIG. 11(b) is a cross-sectional view taken along line A-A of FIG. 11(a); and FIG. 12 is an explanatory diagram of the pattern observation method according to the comparison example, FIG. 12(a) is a cross-sectional view showing a charged state of the L/S pattern, and FIG. 12(b) is a schematic diagram of an observed secondary electron image.

DESCRIPTION OF THE EMBODIMENTS

Before the description of embodiments of the present invention, a description will be given of the background to the present inventor developing the present invention.

According to the aforesaid method described in Japanese Patent Application Laid-Open No. 2002-270655, even if a pattern has a large aspect ratio, its space bottom surface can be observed clearly. However, this method, which is effective in a case where the space bottom surface is electrically continuous to a substrate kept to a predetermined potential, is not effective in a case where the space bottom surface is floating in potential.

As an example in which the space bottom surface is floating in potential, for example, an L/S pattern may be given which is all composed of an insulating film. In a process of manufacturing a nowadays semiconductor device having a multi-layer structure, in many cases, to form an upper-layer interconnection, an insulating film is deposited and then a trench is formed in this insulating film, thereby forming an L/S pattern not electrically continuous to the substrate.

As another example in which the space bottom surface is floating in potential, a mask pattern in a so-called sidewall processing process may be given. The sidewall processing process refers to a semiconductor process capable of forming a pattern smaller than the minimum resolution of an exposure device. One example of this semiconductor process will be described as follows. First, a pattern is formed with lithography on an insulating film which serves as a mask material and then thinned by wet etching. On sidewalls of this thinned pattern, an insulating film (sidewall insulating film) is formed. Then, the thinned pattern that lie between the sidewall insulating films are removed. Thus, an L/S pattern is formed which has a pitch not smaller than the minimum resolution of the exposure device. The L/S pattern will be used as a mask pattern, so that it is extremely important that the thinned pattern between the sidewall insulating films should be removed sufficiently.

Next, a description will be given, with reference to FIGS. 11 and 12, of the reasons why a pattern bottom surface cannot clearly be observed if it is floating in potential.

FIG. 11(a) shows a plan view of an L/S pattern 11 which is all composed of an insulating film. FIG. 11(b) is a cross-sectional view taken along line A-A of FIG. 11(a). As shown in FIGS. 11(a) and 11(b), in the L/S pattern 11, a line pattern 12 and a space pattern 13 are disposed alternately.

Observation regions of the L/S pattern 11 are irradiated with an electron beam under positive charging conditions, that is, its secondary electron emission coefficient exceeds one. As a result, as can be seen from FIG. 12(a), the line pattern 12 and the space pattern 13 are both charged positively. Since a line top surface 12a and a space bottom surface 13a are charged to the same extent, there is no difference in potential between the line top surface 12a and the space bottom surface 13a, thus producing no electric field.

Then, under observation conditions (for example, under conditions where the secondary electron emission coefficient is one), the L/S pattern 11 is scanned with an electron beam. Since there is no electric field between the line top surface 12a and the space bottom surface 13a, as can be seen from FIG. 12(a), effects are not obtained of drawing out secondary electrons emitted from the space bottom surface 13a toward a vacuum side (upper side in FIG. 12(a)), so that the secondary electrons cannot efficiently reach a detector. As a result, as can be seen from FIG. 12(b), in a secondary electron image, a line pattern region 14 is bright but a space pattern region 15 is dark, similar to the case of ordinary observation.

Thus, if the space bottom surface 13a is not grounded, it cannot be observed brightly even by the aforesaid comparison example method.

Accordingly, conventionally, in order to observe the bottom surface of a concave pattern, which is combined with a convex pattern on an insulating film, such an approach has been employed as to cleave a wafer and check its cross-sectional surfaces. However, this method takes much time to carry out and, moreover, has a problem in that in-line inspection is impossible. Here, in-line inspection refers to taking a sample wafer from a semiconductor device manufacturing process, observing patterns on the wafer, and placing it back to a manufacturing line.

As described above, conventionally, a strong desire has been present for a pattern observation method that can clearly observe the bottom surface of a concave pattern formed in an insulating film.

The present invention has been developed based on the aforesaid unique technological recognition of the present inventor and, as described in the following embodiments, provides a pattern observation method that can clearly observe the bottom surface of a concave pattern combined with a convex pattern on an insulating film. The present pattern observation method may be such as follows more specifically.

First, both of a concave pattern and a convex pattern which are formed on an insulating film are irradiated with an observing charged particle beam. Thus, a temporary image of the concave and convex patterns is obtained which has region information of a convex pattern region corresponding to the convex pattern and region information of a concave pattern region corresponding to the concave pattern. It is to be noted that the region information contains information about at least any one of a position, a shape, and a dimension (size) of the convex pattern region (or concave pattern region).

Subsequently, the convex pattern region is irradiated with an electric field forming charged particle beam having a first incident voltage and the concave pattern region is irradiated with an electric field forming charged particle beam having a second incident voltage different from the first incident voltage based on the region information of the convex pattern region and the region information of the concave pattern region respectively. Thus, an electric field is formed between a top surface of the convex pattern and a bottom surface of the concave pattern. This electric field is utilized to draw charged particles emitted from the bottom surface of the concave pattern when this bottom surface is irradiated with the observing charged particle beam, to the outside of the pattern.

After such an electric field is formed, both of the concave pattern and the convex pattern in the concave-convex pattern are irradiated with an observing charged particle beam. Thus, an image is obtained of the concave-and-convex pattern having the information of the bottom surface of the concave pattern.

In such a manner, even in a case where the bottom surface of the concave pattern is floating in potential, an electric field formed between the top surface of the convex pattern and the bottom surface of the concave pattern can be utilized so that charged particles emitted from the bottom surface of the concave pattern may be drawn out of the concave-convex pattern efficiently. As a result, the bottom surface of the concave pattern can be observed clearly.

A description will be given below of three embodiments according to the present invention with reference to the drawings. It is to be noted that identical reference numerals are given to similar components in the drawings, and detailed description on the similar components will not be repeated.

First Embodiment

Figure 1:
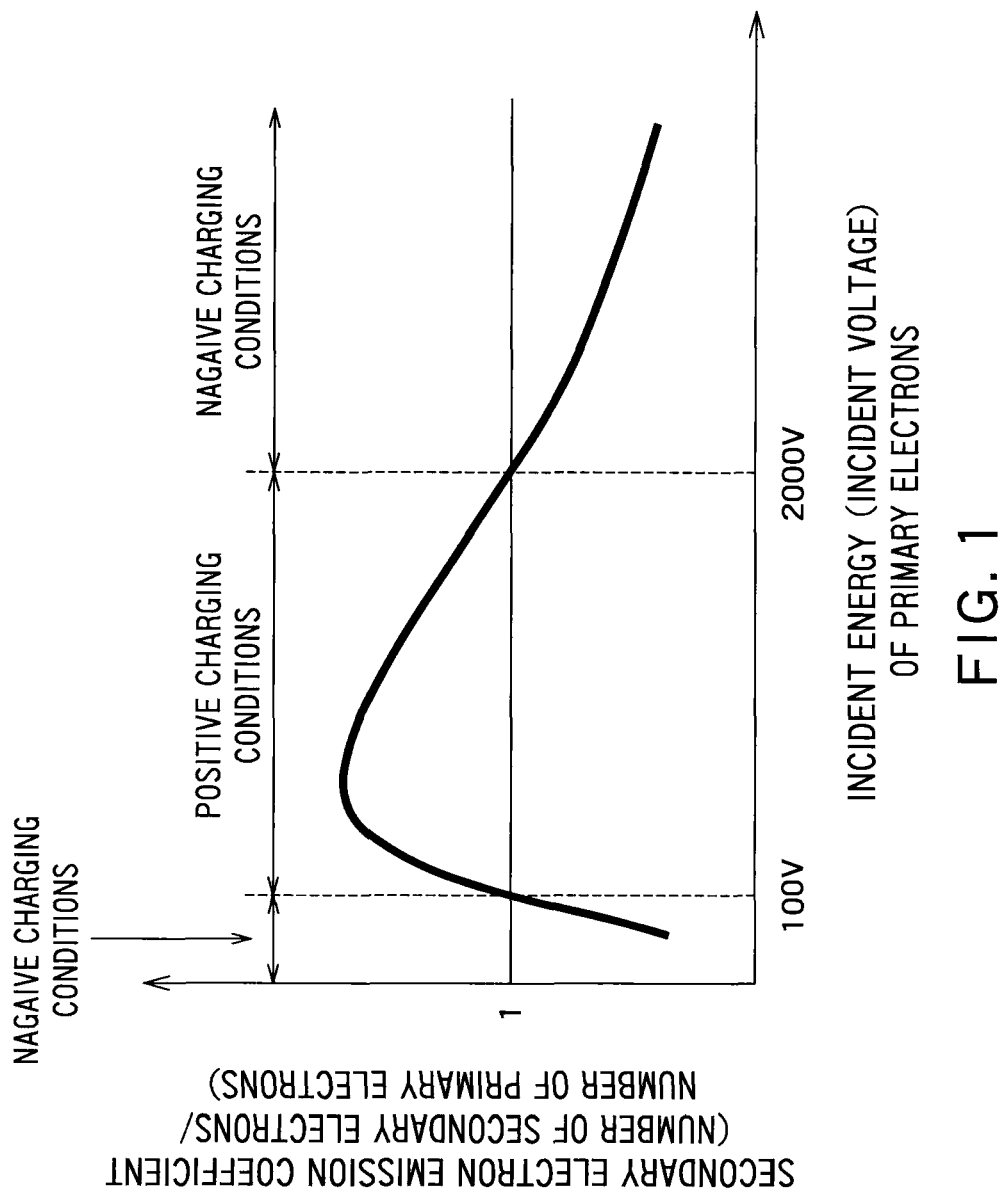
FIG. 1 is a table showing incident voltage dependency of a secondary electron emission coefficient of an oxide film (SiO$_2$)

Before the description of a pattern observation method according to a first embodiment of the present invention, a description will be given of a relationship between an incident voltage (incident energy) of primary electrons and a secondary electron emission coefficient, with reference to FIG. 1. The secondary electron emission coefficient refers to a ratio of the number of emitted secondary electrons as against the number of primary electrons made incident upon a sample (=number of secondary electrons/number of primary electrons). FIG. 1 shows incident voltage dependency of the secondary electron emission coefficient of a silicon oxide film ($SiO_2$). As can be seen from FIG. 1, insulating films such as a silicon oxide film may come under positive charging conditions where the secondary electron emission coefficient is in excess of one and negative charging conditions where the secondary electron emission coefficient is less than one.

As can be seen from FIG. 1, for the silicon oxide films, a case where the incident voltage for primary electrons is lower than 100 V and a case where it is higher than 2000 V are negative charging conditions, and a case where the incident voltage is higher than 100 V and lower than 2000 V is positive charging conditions.

If an insulating film is irradiated with an electron beam under the negative charging conditions, secondary electrons emitted from the sample are outnumbered by incident primary electrons because the secondary electron emission coefficient is less than one. Therefore, a region irradiated with the electron beam is negatively charged. On the other hand, if the insulating film is irradiated with an electron beam under the positive charging conditions, secondary electrons emitted from the sample outnumber incident primary electrons because the secondary electron emission coefficient is larger than one. Therefore, a region irradiated with the electron beam is positively charged.

It is to be noted that conditions where the secondary electron emission coefficient is just one will be used preferably as sample observation conditions, that is, observation conditions because the sample will not be charged.

Figure 2:
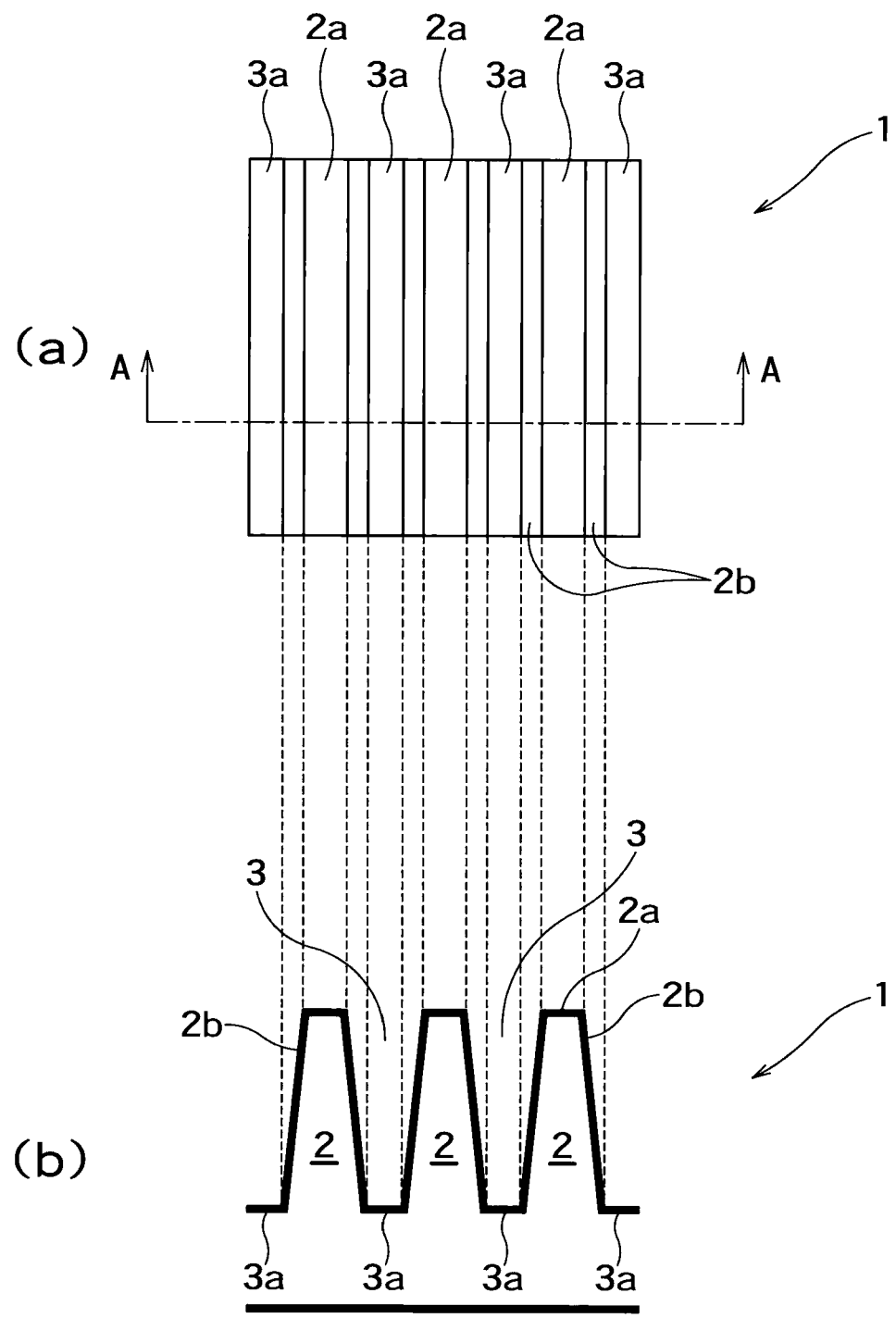
FIG. 2 is an explanatory diagram of a structure of an L/S pattern.

In the present embodiment, a sample to be observed is an L/S pattern 1 composed of an insulating film (silicon oxide film shown in FIG. 2(a)). FIG. 2(b) is a cross-sectional view taken along line A-A of FIG. 2(a). As can be seen from FIGS. 2(a) and 2(b), the L/S pattern 1 has a line pattern 2 and a space pattern 3 which are disposed alternately.

Figure 3:
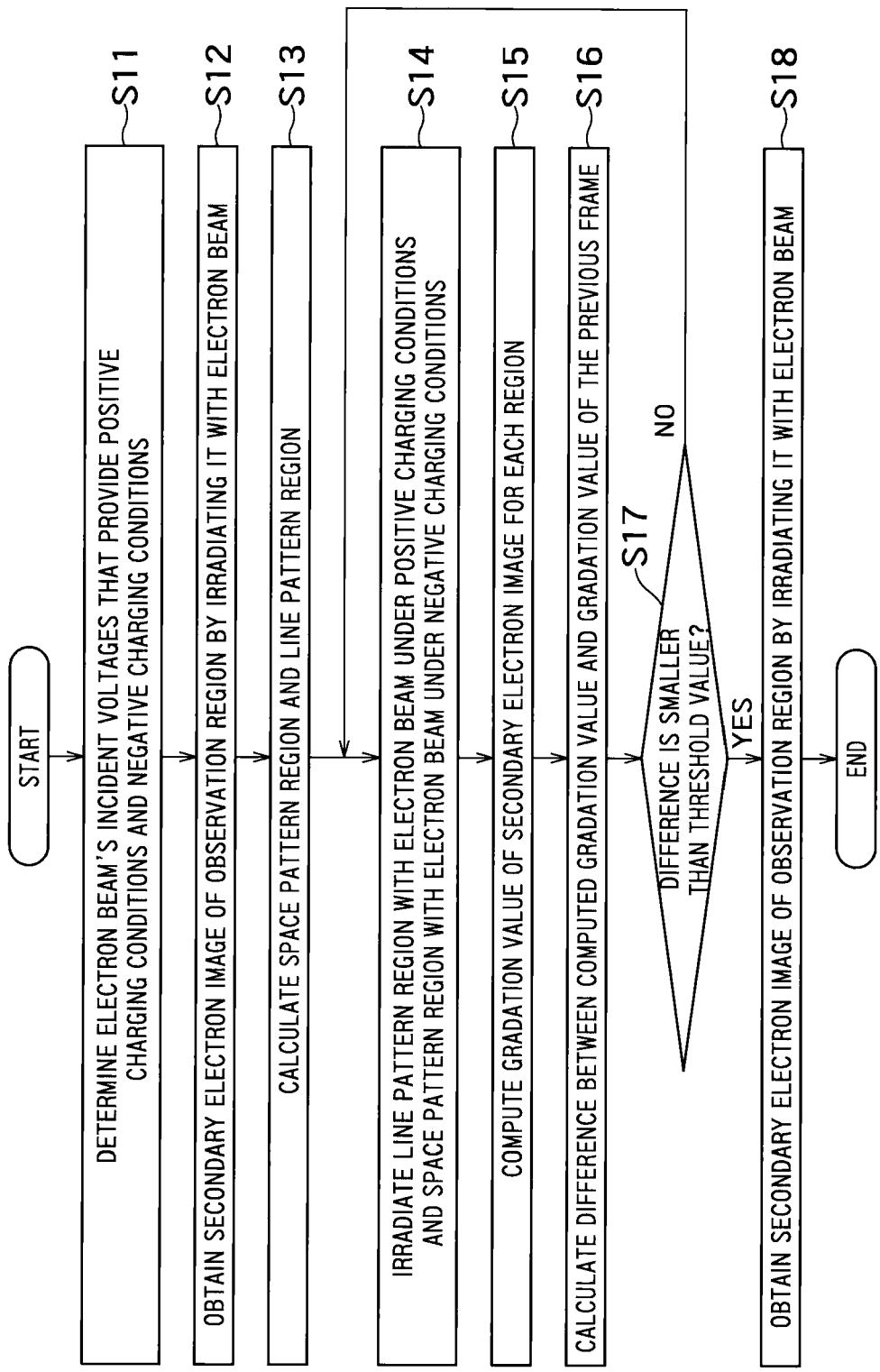
FIG. 3 is a flowchart of a pattern observation method according to a first embodiment.

A description will be given below of a pattern observation method according to the present embodiment along a flowchart shown in FIG. 3.

(1) First, an electron beam's incident voltage that provides the positive charging conditions and an electron beam's incident voltage that provides the negative charging conditions are determined (step S11). The secondary electron emission coefficient changes greatly with the material of a sample. Therefore, it is necessary to determine the incident voltages that provide the positive charging conditions and the negative charging conditions respectively in accordance with the material of the sample. For example, in the case of a silicon oxide film ($SiO_2$), as can be seen from FIG. 1, the electron beam's incident voltage Vin that gives positive charging is 100<Vin<200[V], and the electron beam's incident voltage Vin that gives negative charging is Vin<100[V] or Vin>2000[V].

Figure 4:
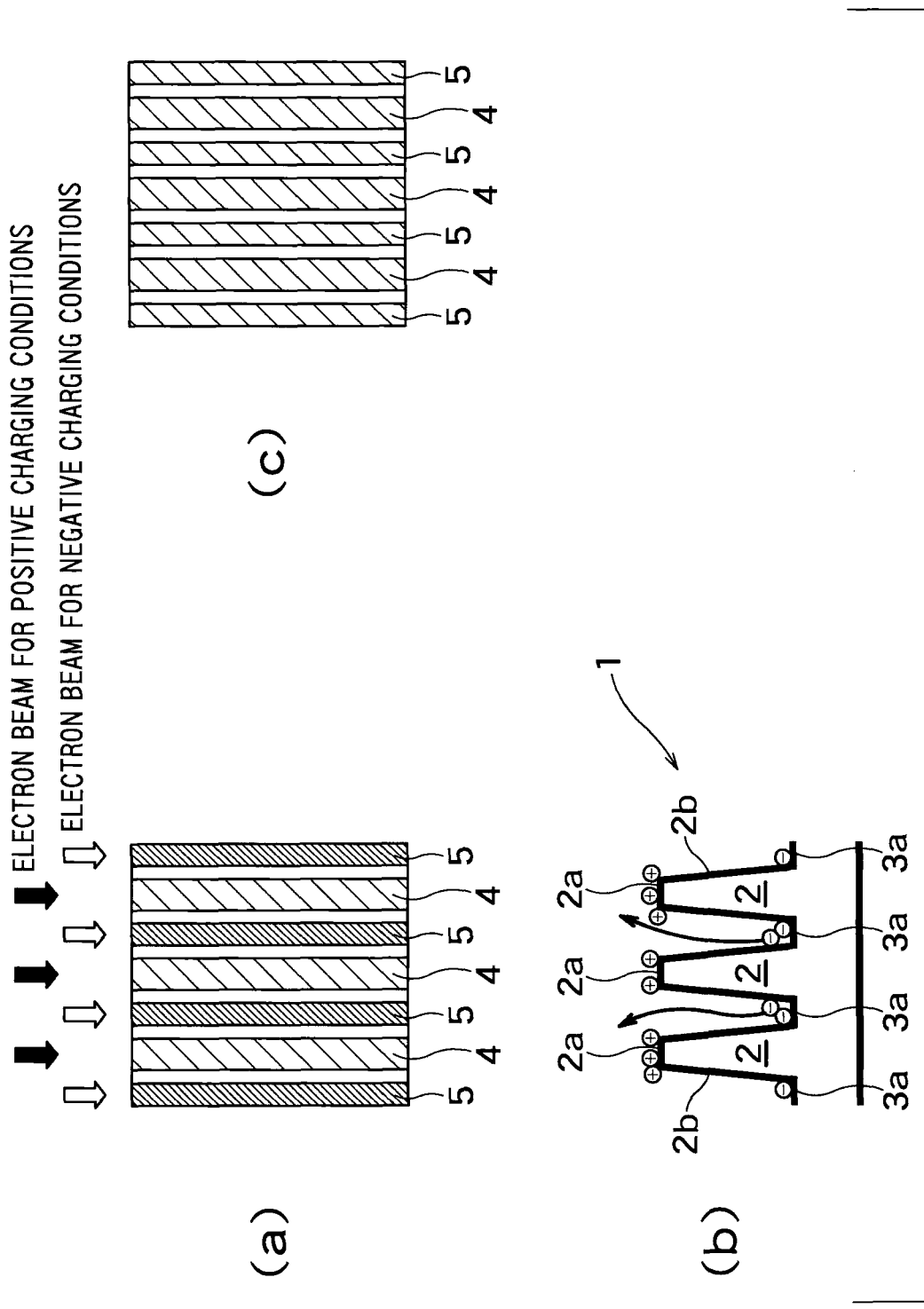
FIG. 4 is an explanatory diagram of the pattern observation method according to the first embodiment.

(2) Next, the L/S pattern 1 is irradiated with the electron beam, to obtain a secondary electron image (temporary image) of an observation region (step S12). FIG. 4(a) shows a schematic diagram of the obtained secondary electron image. As can be seen from FIG. 4(a), a line pattern region 4 is bright but a space pattern region 5 is dark. This is because, as described above, secondary electrons emitted from a space bottom surface 3a of the L/S pattern 1 cannot efficiently be detected. In FIG. 4(a), a white strip-shaped region sandwiched between the line pattern region 4 and the space pattern region 5 indicates a sidewall 2b of the line pattern 2. As an incident angle of primary electrons with respect to the sample gets smaller, the number of the secondary electrons emitted from the sample increases, so that the sidewall 2b may be observed brighter than the line pattern and the space pattern.

It is to be noted that preferably the value of the electron beam's incident voltage at the time of observing the sample surface in this process is selected so that the secondary electron emission coefficient may be one, in order to prevent the insulating film from being charged. For example, in a case where the insulating film is made of a silicon oxide, the incident voltage value should preferably be 100 V or 2000 V.

(3) Next, the secondary electron image obtained at step S12 is used to calculate the line pattern region 4 corresponding to the line pattern 2 and the space pattern region 5 corresponding to the space pattern 3 (step S13). They may be calculated by a method that determines a region based on a difference in a gradation value of the L/S pattern, a method that extracts an outline of the pattern by utilizing image processing, etc. The thus calculated line pattern region 4 and space pattern region 5 are shown in FIG. 4(a). As can be seen from FIG. 4(a), the line pattern region 4 contains information about a position, a shape, and a dimension (line width) of the line pattern 2, and the space pattern region 5 contains information about a position, a shape, and a dimension (line width) of the space pattern 3.

(4) Next, as can be seen from FIG. 4(a), the line pattern region 4 is irradiated with an electron beam under the positive charging conditions, and the space pattern region 5 is irradiated with an electron beam under the negative charging conditions (step S14). For example, the line pattern region 4 is irradiated with an electron beam having an incident voltage of 800 V, which is the positive charging conditions, and the space pattern region 5 is irradiated with an electron beam having an incident voltage of 2500 V or 50 V, which is the negative charging conditions. It is to be noted that these regions may be irradiated with the electron beam in an arbitrary order.

A description will be given below of three methods about scanning by use of an electron beam.

By the first scanning method, the L/S pattern 1 is scanned with an electron beam in its longitudinal direction. That is, in FIG. 4(a), a space pattern region 5 is scanned with the electron beam in the longitudinal direction (vertical direction in the figure) under the negative charging conditions and then, the incident voltage is switched to that for the positive charging conditions, to scan a line pattern region 4 adjacent to this space pattern region 5 with the electron beam in the longitudinal direction. This scanning is performed from the left to the right in the figure each time the incident voltage conditions are switched alternately. Thus, the entire observation region is irradiated with the electron beam.

By the second scanning method, a plurality of space pattern regions 5 and a plurality of line pattern regions 4 are scanned as one group respectively. That is, first, only the plurality of space pattern regions 5 in the observation region may be scanned until all the space pattern regions 5 in the observation region are scanned under the negative charging conditions finally. Then, the incident voltage may be switched, to scan only the plurality of line pattern regions 4 in the observation region until all the line pattern regions 4 in the observation region are scanned under the positive charging conditions finally. Oppositely, first, only the line pattern regions 4 in the observation region are scanned until all the line pattern regions 4 in the observation region are scanned under the positive charging conditions finally. Then, only the space pattern regions 5 may be scanned under the negative charging conditions. This second scanning method has an advantage in that the incident voltage need not be switched quickly in accordance with the pattern.

By the third scanning method, the L/S pattern 1 may be scanned with an electron beam in a direction perpendicular to it (horizontal direction in the FIG. 4(a)). In this case, the incident voltage is switched from that for the positive charging conditions to that for the negative charging conditions when the region irradiated with an electron beam is transferred from the line pattern region 4 to the space pattern region 5. On the other hand, when the irradiation region is transferred from the space pattern region 5 to the line pattern region 4, the incident voltage is switched from that for the negative charging conditions to that for the positive charging conditions.

It is to be noted that scanning the observation region once by such a method is referred to as one frame. Generally, only one frame of scanning is not enough to obtain a desired charged state. That is, in order to obtain a desired charged state, typically, a plurality of frames of scanning is performed. In such a case of performing a plurality of frames of scanning, the charged state will be saturated gradually in accordance with a certain time constant. Therefore, as described in the subsequent processes, it is necessary to determine whether the charged state is saturated.

(5) Next, gradation values of the line pattern region 4 and the space pattern region 5 are respectively calculated using the detected data of secondary electrons emitted from the L/S pattern 1 when it is irradiated with an electron beam at step S14 (step S15).

(6) Next, a difference $\Delta_L$ is calculated between the gradation value of the line pattern region 4 obtained at step S15 and that of the line pattern region 4 obtained at the previous frame. Similarly, a difference $\Delta_S$ is calculated between the gradation value of the space pattern region 5 obtained at step S15 and that of the space pattern region 5 obtained at the previous frame (step S16). It is to be noted that when this process is performed for the first time (at the first frame), the gradation value obtained at step S15 is used as it is as the difference.

(7) Next, the difference $\Delta_L$ of the gradation value of the line pattern region 4 obtained at step S16 is compared to a preset threshold value $X_L$. Similarly, the difference $\Delta_S$ of the gradation value of the space pattern region 5 obtained at step S16 is compared to a preset threshold value $X_S$. As a result, if the differences calculated at step S16 are smaller than the respective threshold values, that is, if $\Delta_L < X_L$ and $\Delta_S < X_S$, the scanning ends to advance to step S18. Otherwise, the procedure returns to step S14 (step S17).

The processing of steps S14 to S17 is thus repeated until the differences of the gradation values are lowered below the respective thresholds (predetermined values). In such a manner, a desired charged state is obtained.

It is to be noted that there are possibilities that the differences of the gradation values may not be lowered below the respective threshold values even if the processing of steps S14 to S17 is repeated any number of times, depending on the material or structure of the sample. Therefore, an upper limit of the number of frames (the number of times of performing the processing of steps S14 to S16) is set beforehand so that even if the differences are not lowered below the threshold values, the procedure may advance to step S18 if the upper limit is reached.

Such a charged state as shown in FIG. 4(b) is obtained by thus scanning the observation region as switching the incident voltage between the value for the positive charging conditions and that for the negative charging conditions in accordance with the patterns. FIG. 4(b) is a cross-sectional view of the L/S pattern, showing a charged state after this scanning is completed, that is, a charged state after the differences of the gradation values are lowered below the threshold values. As can be seen from FIG. 4(b), a line top surface 2a is charged positively and a space bottom surface 3a, negatively. By forming such a charged state, a local electric field is generated between the line top surface 2a and the space bottom surface 3a.

(8) Next, the L/S pattern 1 is irradiated with an electron beam, to obtain a secondary electron image of the observation region (step S18). Similar to step S12, preferably the electron beam incident voltage is the value under the observation conditions (for example, 100 V or 2000 V). The local electric field formed by the charged state shown in FIG. 4(b) causes secondary electrons emitted from the space bottom surface 3a to be attracted by positive charge on the line top surface 2a, thus getting away to the side of vacuum (upper side in the figure). As a result, the secondary electrons emitted from the space bottom surface 3a can be detected efficiently by a detector. FIG. 4C is a schematic diagram of a secondary electron image obtained in this process. As can be seen from FIG. 4C, not only the line pattern region 4 but also the space pattern region 5 are observed brightly.

In such a manner, in the present embodiment, the secondary electron image of an L/S pattern observed beforehand is used to calculate a space pattern region and a line pattern region. Then, the line pattern region is irradiated with an electron beam under the positive charging conditions and the space pattern region is irradiated with the electron beam under the negative charging conditions. Thus, a local electric field is formed between the top surface of a line pattern and the bottom surface of a space pattern. Then, an observation region is irradiated with the electron beam. Secondary electrons emitted from the space pattern's bottom surface are attracted by the local electric field, thus being taken out to the line pattern efficiently. As a result, by the pattern observation method according to the present embodiment, an efficiency is improved of detecting the secondary electrons, thus enabling clearly observing the bottom surface of the space pattern even if the L/S pattern is made of an insulating film.

Second Embodiment

Next, a description will be given of a pattern observation method according to a second embodiment of the present invention. One of differences between the second embodiment and the first embodiment is a method of irradiation with an electron beam when generating a local electric field. In the first embodiment, the pattern has been irradiated with an electron beam whose focus position is set on the surface of a sample. In this case, to charge the sample sufficiently, a lot of scanning electron beams are required (for example, at least 400 scanning electron beams are necessary for one observation region). In contrast, in the present embodiment, an electron beam will be used whose focus position is shifted from the surface of the sample toward its inside so that the beam diameter of this electron beam on the top surface of the sample may be equal to a line width of the pattern. Moreover, besides the shifting of the focus position, an electron density of the electron beam is enhanced. Thus, the number of scanning electron beams required to sufficiently charge the sample will be decreased significantly. As a result, a time necessary in observation can be reduced greatly.

Figure 5:
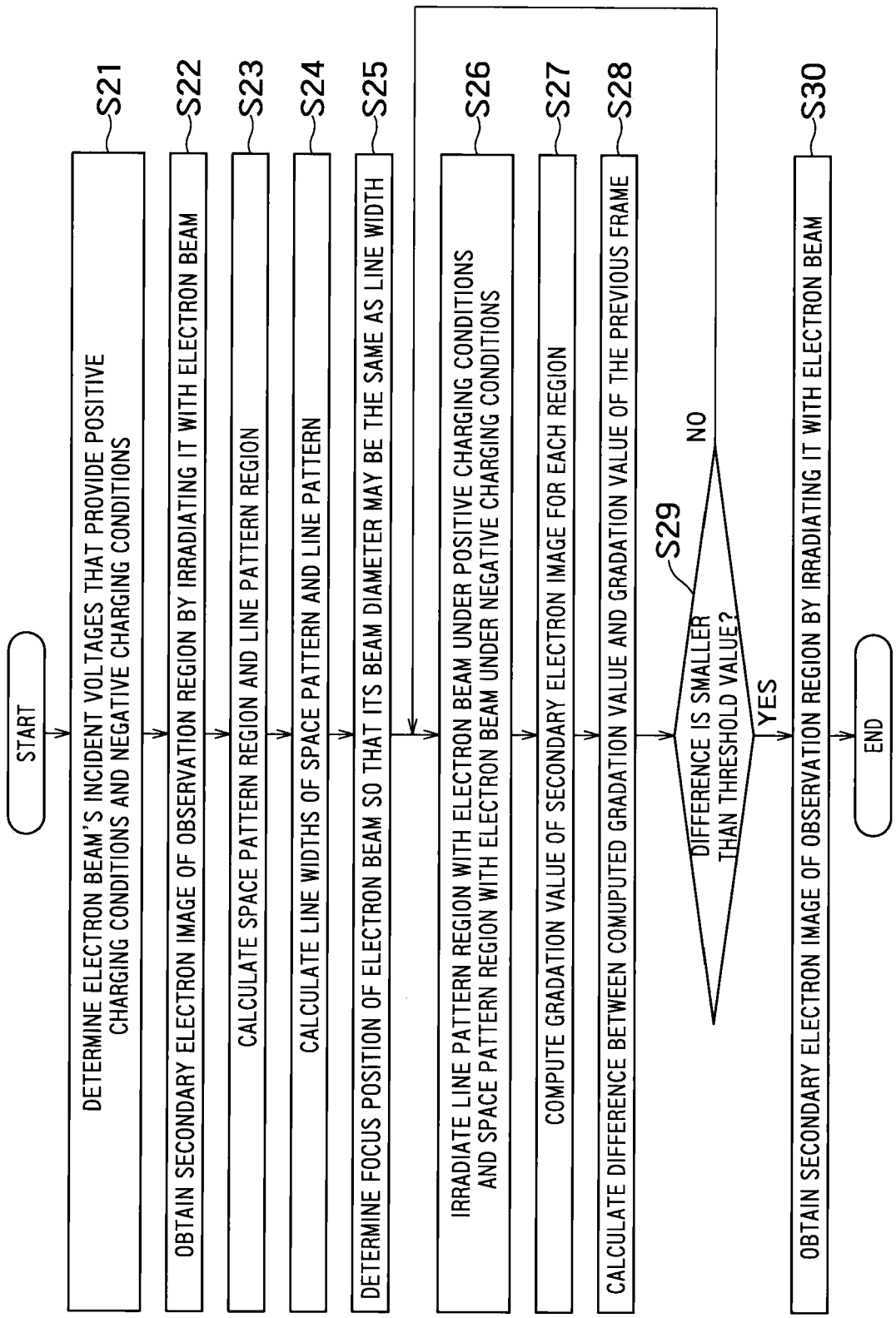
FIG. 5 is a flowchart of a pattern observation method according to a second embodiment.

A description will be given below of the pattern observation method according to the present embodiment along a flowchart shown in FIG. 5. Steps S21 to S23 are similar to steps S11 to S13 described with the first embodiment, and repetitive description on them will not be repeated, to start description from step S24.

(1) A line pattern region 4 and a space pattern region 5 calculated at step S23 are used to calculate the line widths of a line pattern 2 and a space pattern 3 respectively (step S24).

(2) Next, the focus position of an electron beam with which the line pattern region is to be irradiated is determined so that a beam diameter of this electron beam may be equal to the line width of the line pattern 2 calculated at step S24 on an irradiation surface (top surface of the line pattern 2). Similarly, the focus position of an electron beam with which the space pattern region is to be irradiated is determined so that a beam diameter of this electron beam may be equal to the line width of the space pattern 3 calculated at step S24 on an irradiation surface (bottom surface of the space pattern 3) (step S25).

Figure 6:
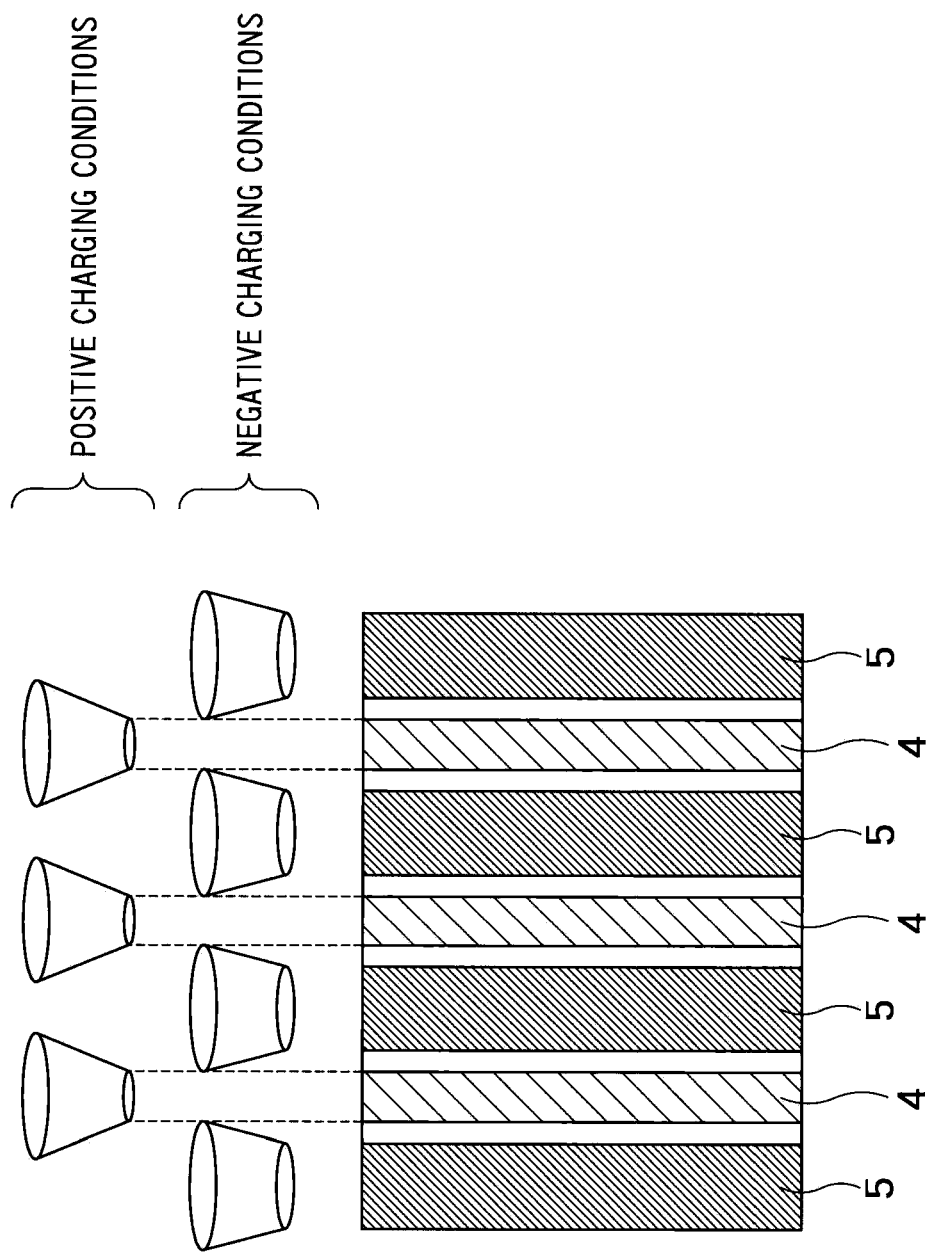
FIG. 6 is an explanatory diagram of the pattern observation method according to the second embodiment.

FIG. 6 shows a relationship between the schematic diagram of a secondary electron image obtained at S22 and the electron beam used in irradiation. In this example shown in FIG. 6, the space pattern region 5 has a larger line width than that of the line pattern region 4. Therefore, in the space pattern region 5, the focus position of the electron beam is greatly shifted from the irradiation surface toward the inside of a sample. On the other hand, in the line pattern region 4, the focus position is comparatively slightly shifted from the irradiation surface toward the inside of the sample. By thus adjusting the focus positions, the beam diameter of the electron beam matches each of the pattern line widths calculated at step S24.

The following steps S26 to S30 are similar to steps S14 to S18 described with the first embodiment, and repetitive description on them will not be repeated. However, in irradiation at step S26, the electron beam used in it has a higher current than that in the first embodiment. It is done so in order to compensate for a decrease in number of electrons incident upon a unit area of the sample which decrease is caused by a shift in a focus position from the sample surface.

As described already, typically, the number of scanning electron beams used for one observation region is at least 400. However, by the present embodiment, as described above, the focus position is adjusted so that the electron beam diameter may be equal to a line width of the pattern to be irradiated and, at the same time, the current of the electron beams is enhanced so that the number of electrons which are made incident upon the unit area may not decrease. Thus, only by scanning each of the line pattern region and the space pattern region once, one frame of irradiation with the electron beams can be completed to form a predetermined charged state. That is, in the case of an observation region including four space patterns and three line patterns as shown, for example, in FIG. 6, a predetermined charged state can be obtained only by scanning each of the patterns once. Therefore, one frame of scanning can be completed by scanning them with the electron beam only seven times in total.

Thus, by the present embodiment, similar to the case of the first embodiment, even if the L/S pattern is made of an insulating film, the bottom surface of the space pattern can be observed clearly. Moreover, the present embodiment enables reducing the number of scanning electron beams significantly, thereby reducing an observation time of the sample greatly.

So far, there have been described the two embodiments according to the present invention. In the description of the first and second embodiments, the line pattern (convex pattern) has been irradiated with an electron beam under the positive charging conditions and the space pattern (concave pattern) has been irradiated with an electron beam under the negative charging conditions. More generally, by the present invention, instead of whether it is under the positive charging conditions or the negative charging conditions, the line pattern and the space pattern may be irradiated with the electron beams under irradiation conditions having different secondary electron emission efficiencies. That is, the convex line pattern may be irradiated with the electron beam under the irradiation conditions having a secondary electron emission coefficient and the concave space pattern, under the irradiation conditions having a secondary electron emission coefficient $\eta_2$ ($\eta_1 > \eta_2$). Thus, an electric field to draw secondary electrons out of the L/S pattern to be observed is formed between the line pattern's top surface and the space pattern's bottom surface.

Although the first and second embodiments have been described with reference to the example of using an L/S pattern as a pattern to be observed, the observation method according to the present invention can be applied also to any patterns other than the L/S pattern. That is, by the observation method according to the present invention, the bottom surface of a concave pattern on an insulating film having arbitrarily-shaped concave-convex pattern can be observed clearly.

Third Embodiment

Next, a description will be given of a pattern observation method according to a third embodiment of the present invention. One of differences of the third embodiment from the first embodiment is that in contrast to the first embodiment, in which two irradiation regions (a line pattern region and a space pattern region) calculated from a secondary electron image of an observation region have been irradiated with electron beams under the different conditions, the present embodiment will calculate three irradiation regions from the secondary electron image of the observation region and irradiate them with the electron beams under the different conditions. By this method, even in a two-step hole pattern formed in an insulating film, that is, two-step hole pattern having a hole pattern (first hole pattern) and another hole pattern (second hole pattern) formed on the bottom surface of the first hole pattern, the bottom surface of each of those hole patterns can be observed clearly. Such a two-step hole pattern can be found in, for example, a dual damascene structure.

Figure 7:
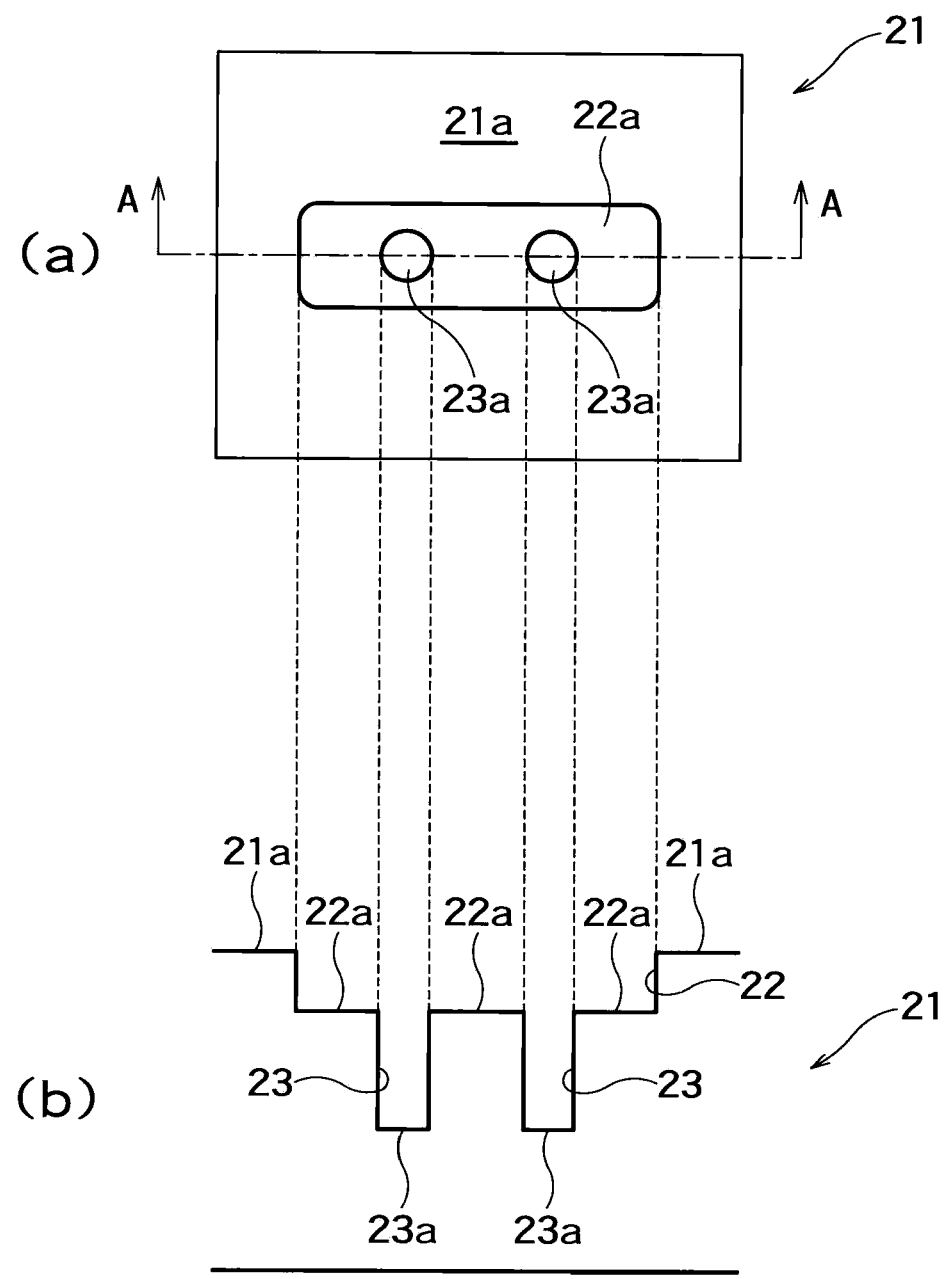
FIG. 7 is an explanatory diagram of a structure of a two-step hole pattern.

FIG. 7 shows a structure of a two-step hole pattern 21 to be observed. FIG. 7(a) is a plan view of this hole pattern 21 and FIG. 7(b) is a cross-sectional view taken along line A-A of FIG. 7(a). As can be seen from FIGS. 7(a) and 7(b), in a top surface 21a of the two-step hole pattern 21, a first hole pattern 22 is formed, and in a bottom surface 22a of this first hole pattern 22, a second hole pattern 23 is formed.

Figure 8:
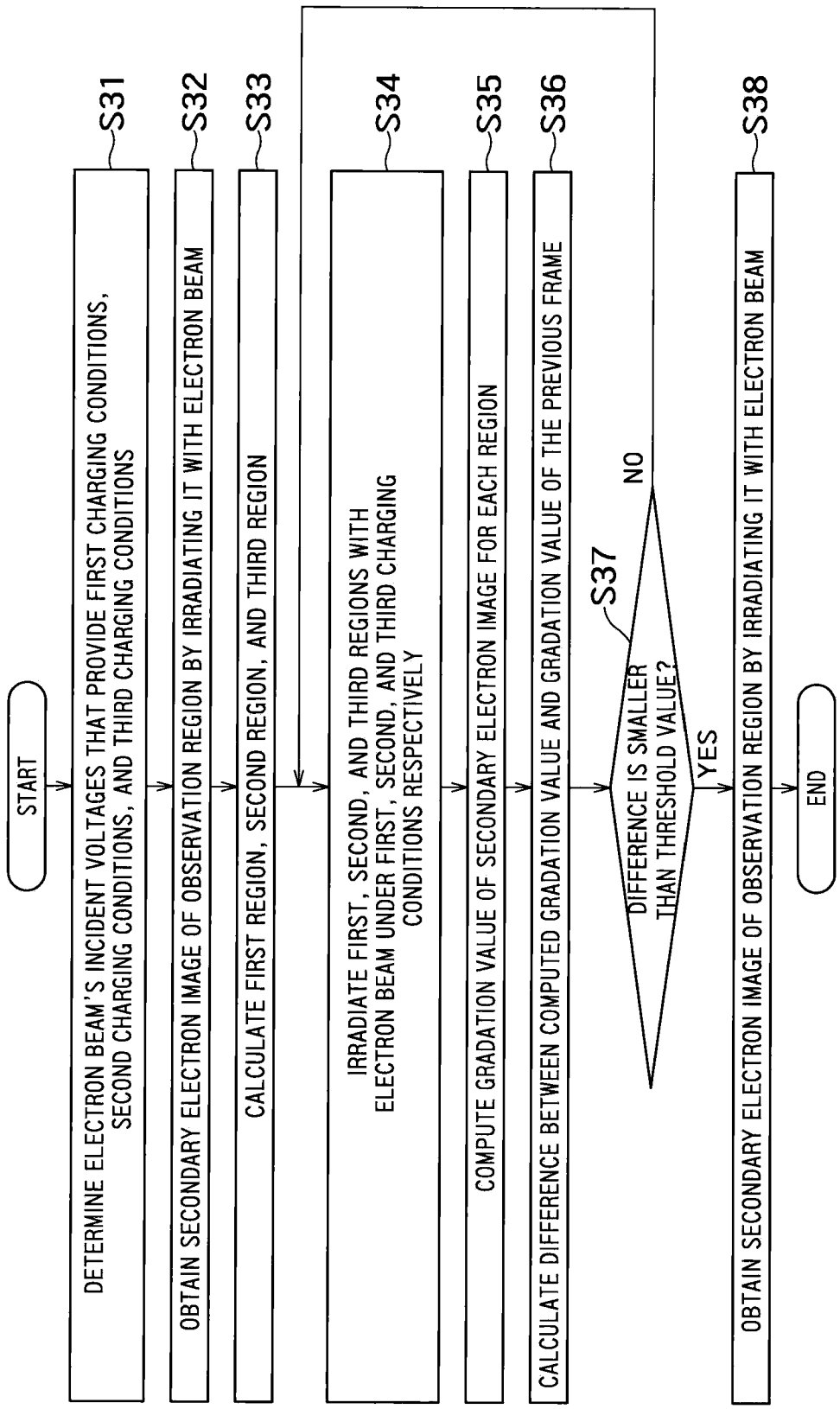
FIG. 8 is a flowchart of a pattern observation method according to a third embodiment.

Next, a description will be given of the pattern observation method according to the present embodiment along a flowchart shown in FIG. 8.

Figure 9:
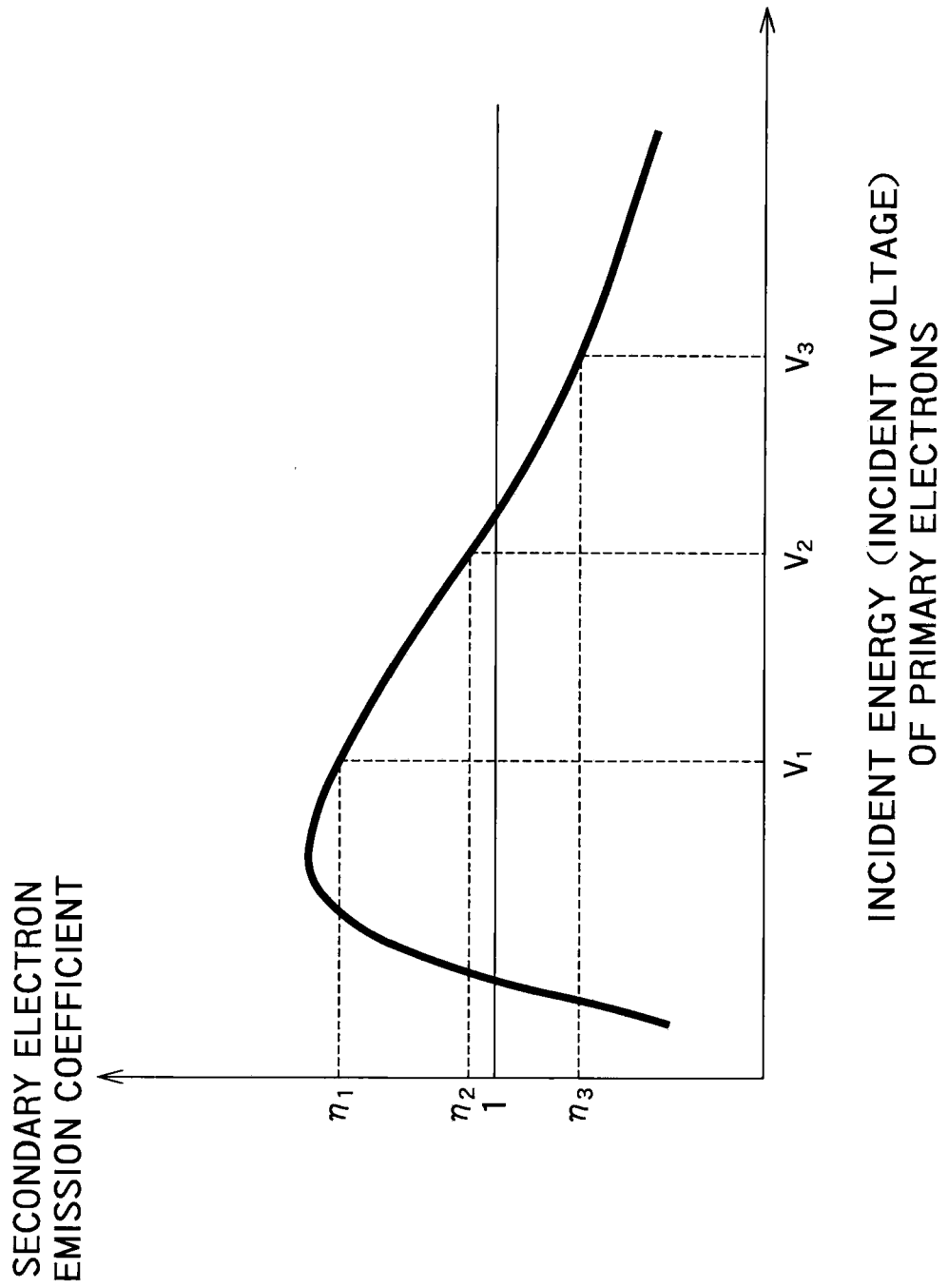
FIG. 9 is a table showing a relationship between an incident voltage and a secondary electron emission coefficient in the third embodiment.

(1) First, an electron beam's incident voltage $V_1$ that provides the first charging conditions, an electron beam's incident voltage $V_2$ that provides the second charging conditions, and an electron beam's incident voltage $V_3$ that provides the third charging conditions are determined (step S31). Assuming here that secondary electron emission efficiencies corresponding to the incident voltages $V_1$, $V_2$, and $V_3$ to be $\eta_1$, $\eta_2$, and $\eta_3$ respectively, the incident voltages $V_1$, $V_2$, and $V_3$ are determined so that a relationship of $\eta_1 > \eta_2 > \eta_3$ may be established. FIG. 9 shows one example of the thus determined relationship between $V_1$, $V_2$, and $V_3$ and $\eta_1$, $\eta_2$ and $\eta_3$.

(2) Next, an entire observation region of the two-step hole pattern 21 is irradiated with an electron beam, to obtain a secondary electron image (temporary image) of the observation region (step S32). This secondary electron image has region information of a first region corresponding to the top surface 21a of the two-step hole pattern 21, region information of a second region corresponding to the bottom surface 22a of the first hole pattern 22, and region information of a third region corresponding to the bottom surface 23a of the second hole pattern 23.

Figure 10:
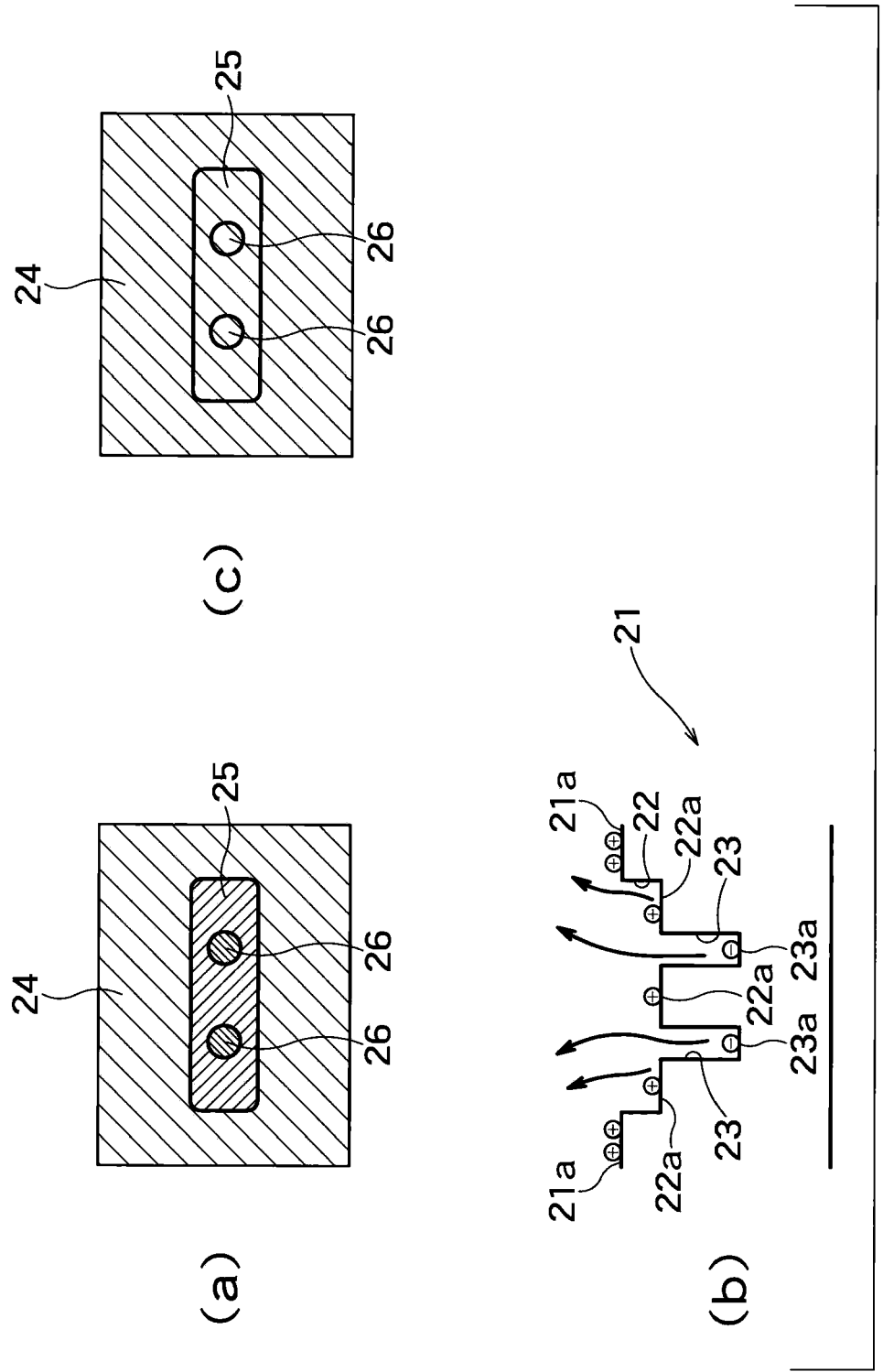
FIG. 10 is an explanatory diagram of the pattern observation method according to the third embodiment.

(3) Next, the secondary electron image obtained at step S32 is used to calculate a first region 24 corresponding to the top surface 21a of the two-step hole pattern 21, a second region 25 corresponding to the bottom surface 22a of the first hole pattern 22, and a third region 26 corresponding to the bottom surface 23a of the second hole pattern 23 (step S33). FIG. 10(a) shows the thus calculated first region 24, second region 25, and third region 26.

(4) Next, the first region 24 is irradiated with an electron beam under the first charging conditions (incident voltage $V_1$), the second region 25 is irradiated with an electron beam under the second charging conditions (incident voltage $V_2$), and the third region 26 is irradiated with an electron beam under the third charging conditions (incident voltage $V_3$) (step S34). It is to be noted that these regions may be irradiated with the electron beam in arbitrary order.

The following steps S35 to S38 are similar to steps S15 to S18 described with the first embodiment, and repetitive description on them will not be repeated.

FIG. 10(b) is a cross-sectional view of the two-step hole pattern 21, showing one example of the charged state of the two-step hole pattern 21 before the secondary electron image of the observation region is obtained at step S38. As can be seen from FIG. 10(b), the top surface 21a of the two-step hole pattern 21 is charged positively, the bottom surface 22a of the first hole pattern 22 is positively charged weaker than the top surface 21a, and the bottom surface 23a of the second hole pattern 23 is charged negatively. By forming such a charged state, local electric fields are respectively generated between the top surface 21a and the bottom surface 22a, between the bottom surface 22a and the bottom surface 23a, and between the top surface 21a and the bottom surface 23a. With this, when the secondary electron image is being obtained of the observation region of the two-step hole pattern 21 by irradiating it with the electron beam at step S38, secondary electrons emitted from the bottom surface 22a of the first hole pattern 22 are attracted by positive charge on the top surface 21a, thus getting drawn out to the side of vacuum (upper side in FIG. 10(b)). On the other hand, secondary electrons emitted from the bottom surface 23a of the second hole pattern 23 are attracted by positive charge on the top surface 21a and the bottom surface 22a, thus getting drawn out to the side of vacuum. As a result, the secondary electrons emitted from the bottom surfaces 22a and 23a can be detected efficiently. FIG. 10(c) is a schematic diagram of a secondary electron image of the observation region of the two-step hole pattern 21 obtained at step S38. As can be seen from FIG. 10(c), not only the top surface 21a of the two-step hole pattern 21 but also the bottom surfaces 22a and 23a of the respective first and second hole patterns 22 and 23 are observed brightly.

It is to be noted that although the present embodiment has been described with reference to the two-step hole pattern, even in the case of a hole pattern having at least three steps, its respective bottom surfaces can be clearly observed by extending and applying the method according to the present embodiment.

As thus described, by the pattern observation method according to the present embodiment, even in the case of a hole pattern having a shallow hole and a deep hole, bottom surfaces of those respective holes can be observed clearly.

So far, there have been described the three embodiments according to the present invention. Although in the description of these embodiments, an electron beam has been used as a charged particle beam, any other charged particle beams (ion beam) than the electron beam may be used.

Additional advantages and modifications will readily occur to those skilled in the art.

Therefore, the invention in its broader aspects is not limited to the specific details and representative embodiments shown and described herein.

Accordingly, various modifications may be made without departing from the spirit or scope of the general inventive concepts as defined by the appended claims and their equivalents.

What is claimed is:

1. A pattern observation method for observing a pattern formed on an insulating film and having a concave pattern and a convex pattern, the method comprising:
    irradiating both of the concave pattern and the convex pattern in the pattern with a first observing charged particle beam, to obtain a temporary image of the pattern having region information of a convex pattern region corresponding to the convex pattern and region information of a concave pattern region corresponding to the concave pattern;
    irradiating the convex pattern region in the pattern with a first electric field forming charged particle beam having a first incident voltage for forming an electric field in the convex pattern region and irradiating the concave pattern region in the pattern with a second electric field forming charged particle beam having a second incident voltage for forming an electric field in the concave pattern region, wherein the second incident voltage is different from the first incident voltage, based on the region information of the convex pattern region and the region information of the concave pattern region respectively, thereby forming an electric field between a top surface of the convex pattern and a bottom surface of the concave pattern so that charged particles emitted from the bottom surface of the concave pattern when the bottom surface is irradiated with the charged particle beam may be drawn out of the pattern; and
    irradiating both of the concave pattern and the convex pattern in the pattern with a second observing charged particle beam after the electric field is formed, to obtain an image of the pattern having the information of the bottom surface of the concave pattern.

2. The pattern observation method according to claim 1, comprising:
    when irradiating the convex pattern region with the electric field forming charged particle beam having the first incident voltage based on a dimension of the convex pattern which is contained in the region information of the convex pattern region, shifting a focus position of the electric field forming charged particle beam having the first incident voltage toward an inside of the pattern so that a first beam diameter on the top surface of the convex pattern may be equal to the dimension of the convex pattern; and
    when irradiating the concave pattern region with the electric field forming charged particle beam having the second incident voltage based on a dimension of the concave pattern which is contained in the region information of the concave pattern region, shifting a focus position of the electric field forming charged particle beam having the second incident voltage toward an inside of the pattern so that a second beam diameter on the bottom surface of the concave pattern may be equal to the dimension of the concave pattern.

3. The pattern observation method according to claim 2, wherein as the charged particle beam, an electron beam is used.

4. The pattern observation method according to claim 1, wherein as the charged particle beam, an electron beam is used.

5. The pattern observation method according to claim 4, wherein
    the first incident voltage has a secondary electron emission coefficient larger than one, and
    the second incident voltage has a secondary electron emission coefficient smaller than one.

6. The pattern observation method according to claim 4, wherein the first observing charged particle beam and/or the second observing charged particle beam have the incident voltage whose secondary electron emission coefficient is one.

7. The pattern observation method according to claim 4, wherein
    the insulating film is a silicon oxide film,
    the first incident voltage is higher than 100 V and lower than 2000 V, and
    the second incident voltage is lower than 100 V or higher than 2000 V.

8. The pattern observation method of claim 1, wherein the bottom surface of the concave pattern region is insulated.

9. A pattern observation method for observing a line and space pattern formed on an insulating film and having a line pattern and a space pattern, the method comprising:
    irradiating both of the line pattern and the space pattern in the line and space pattern with a first observing electron beam, to obtain a temporary image of the line and space pattern having region information of a line pattern region corresponding to the line pattern and region information of a space pattern region corresponding to the space pattern;
    irradiating the line pattern region with a first electric field forming electron beam having a first incident voltage for forming an electric field in the line pattern region and irradiating the space pattern region with a second electric field forming electron beam having a second incident voltage for forming an electric field in the space pattern region, wherein the second incident voltage results in a smaller secondary electron emission coefficient than that by the first incident voltage, based on the region information of the line pattern region and the region information of the space pattern region respectively, thereby forming an electric field between a top surface of the line pattern and a bottom surface of the space pattern so that secondary electrons emitted from the bottom surface of the space pattern when the bottom surface is irradiated with the electron beam may be drawn out of the line and space pattern; and
    irradiating both of the line pattern and the space pattern in the line and space pattern with a second observing electron beam after the electric field is formed, to obtain an image of the line and space pattern having the information of the bottom surface of the space pattern.

10. The pattern observation method according to claim 9, comprising:
when irradiating the line pattern region with the electric field forming electron beam having the first incident voltage based on a line width of the line pattern which is contained in the region information of the line pattern region, shifting a focus position of the electric field forming electron beam having the first incident voltage toward an inside of the line and space pattern so that a first beam diameter on the top surface of the line pattern may be equal to the line width of the line pattern; and
when irradiating the space pattern region with the electric field forming electron beam having the second incident voltage based on a line width of the space pattern which is contained in the region information of the space pattern region, shifting a focus position of the electric field forming electron beam having the second incident voltage toward an inside of the line and space pattern so that a second beam diameter on the bottom surface of the space pattern may be equal to the line width of the space pattern.

11. The pattern observation method according to claim 10, wherein
the first incident voltage has a secondary electron emission coefficient larger than one, and
the second incident voltage has a secondary electron emission coefficient smaller than one.

12. The pattern observation method according to claim 10, wherein the first observing electron beam and/or the second observing electron beam have the incident voltage whose secondary electron emission coefficient is one.

13. The pattern observation method according to claim 10 wherein
the insulating film is a silicon oxide film,
the first incident voltage is higher than 100 V and lower than 2000 V, and
the second incident voltage is lower than 100 V or higher than 2000 V.

14. The pattern observation method according to claim 9, wherein
the first incident voltage has a secondary electron emission coefficient larger than one, and
the second incident voltage has a secondary electron emission coefficient smaller than one.

15. The pattern observation method according to claim 9, wherein the first observing electron beam and/or the second observing electron beam have the incident voltage whose secondary electron emission coefficient is one.

16. The pattern observation method according to claim 9, wherein
the insulating film is a silicon oxide film,
the first incident voltage is higher than 100 V and lower than 2000 V, and
the second incident voltage is less than 100 V or higher than 2000 V.

17. The pattern observation method of claim 9, wherein the bottom surface of the space pattern region is insulated.

18. A pattern observation method for observing a two-step hole pattern formed on an insulating film and having a first hole pattern and a second hole pattern formed in a bottom surface of the first hole pattern, the method comprising:
irradiating an entire observation region in the two-step hole pattern with a first observing electron beam, to obtain a temporary image of the two-step hole pattern having region information of a first region corresponding to a top surface of the two-step hole pattern, region information of a second region corresponding to a bottom surface of the first hole pattern, and region information of a third region corresponding to a bottom surface of the second hole pattern;
irradiating the first region with a first electric field forming electron beam having a first incident voltage for forming an electric field in the first region, the second region with a second electric field forming electron beam having a second incident voltage for forming an electric field in the second region, wherein the second incident voltage results in a secondary electron emission coefficient smaller than that by the first incident voltage, and the third region with a third electric field forming electron beam having a third incident voltage for forming an electric field in the third region, wherein the third incident voltage results in which gives a secondary electron emission coefficient smaller than that by the second incident voltage, based on the region information of the first region, the region information of the second region, and the region information of the third region, to thereby form an electric field between the top surface of the two-step hole pattern and the bottom surface of the first hole pattern and an electric field between the bottom surface of the first hole pattern and the bottom surface of the second hole pattern so that secondary electrons emitted from the bottom surface of the first hole pattern and the bottom surface of the second hole pattern when they are irradiated with the electron beam may be drawn out to an outside of the two-step hole pattern; and
irradiating the entire observation region in the two-step hole pattern with a second observing electron beam after the electric field is formed, to obtain an image of the two-step hole pattern having the information of the bottom surface of the first hole pattern and the bottom surface of the second hole pattern.

19. The pattern observation method according to claim 18, wherein the first observing electron beam and/or the second observing electron beam have the incident voltage whose secondary electron emission coefficient is one.

20. The pattern observation method of claim 18, wherein the bottom surface of the second hole pattern is insulated.

* * * * *

UNITED STATES PATENT AND TRADEMARK OFFICE
CERTIFICATE OF CORRECTION

| | |
|---|---|
| PATENT NO. | : 8,530,866 B2 |
| APPLICATION NO. | : 12/709264 |
| DATED | : September 10, 2013 |
| INVENTOR(S) | : Abe |

It is certified that error appears in the above-identified patent and that said Letters Patent is hereby corrected as shown below:

In the Claims:

Claim 18, column 16, line 28, change "results in which gives a secondary" to --results in a secondary--.

Signed and Sealed this
Twelfth Day of November, 2013

Teresa Stanek Rea
*Deputy Director of the United States Patent and Trademark Office*